United States Patent
Mohammad et al.

(10) Patent No.: US 7,466,620 B2
(45) Date of Patent: Dec. 16, 2008

(54) SYSTEM AND METHOD FOR LOW POWER WORDLINE LOGIC FOR A MEMORY

(76) Inventors: Baker Mohammad, 13316 Kinder Pass, Austin, TX (US) 78727; Paul Bassett, 8300 Jancy Dr., Austin, TX (US) 78750

( * ) Notice: Subject to any disclaimer, the term of this patent is extended or adjusted under 35 U.S.C. 154(b) by 175 days.

(21) Appl. No.: 11/402,483

(22) Filed: Apr. 11, 2006

(65) Prior Publication Data
US 2007/0153584 A1 Jul. 5, 2007

Related U.S. Application Data

(60) Provisional application No. 60/756,100, filed on Jan. 4, 2006, provisional application No. 60/756,856, filed on Jan. 6, 2006.

(51) Int. Cl.
*G11C 8/00* (2006.01)
(52) U.S. Cl. .................................. 365/230.06; 365/227
(58) Field of Classification Search ................. 365/226, 365/227, 230.06, 227 X, 230.06 O
See application file for complete search history.

(56) References Cited

U.S. PATENT DOCUMENTS

| | | | |
|---|---|---|---|
| 5,408,144 A * | 4/1995 | Sakata et al. | ............ 326/21 |
| 2004/0155314 A1 | 8/2004 | Sakata et al. | |
| 2004/0252574 A1 | 12/2004 | Jamshidi et al. | |
| 2005/0146972 A1 | 7/2005 | Hong | |

* cited by examiner

*Primary Examiner*—VanThu Nguyen
(74) *Attorney, Agent, or Firm*—Nicholas J. Pauley; Joseph B. Agusta; John L. Ciccozzi

(57) ABSTRACT

A method of reducing power consumption of a memory is provided. A request is received to access a memory device, including a decoder, a plurality of wordline drivers and a plurality of wordlines. Each wordline is associated with a wordline driver of the plurality of wordline drivers. The request is decoded by a decoder to determine an address associated with the request. A wordline driver of the plurality of wordline drivers is selectively powered to access the address of the memory device, where the wordline driver is associated with a particular wordline of the plurality of wordlines that is related to the address bits, without powering other wordlines of the plurality of wordlines.

11 Claims, 9 Drawing Sheets

SYSTEM AND METHOD FOR LOW POWER WORDLINE LOGIC FOR A MEMORY

RELATED APPLICATIONS

This application claims the benefit of provisional U.S. Application Ser. No. 60/756,100, entitled "METHOD AND APPARATUS FOR LOW POWER DESIGN UTILIZING POWER GATING," filed Jan. 4, 2006, and provisional U.S. Application Ser. No. 60/756,856, entitled "LOW-POWER WORD-LINE LOGIC", filed on Jan. 6, 2006 each assigned to the assignee of the present application, and incorporated herein by reference in its entirety for all purposes.

BACKGROUND

I. Field

The present disclosure generally relates to systems and methods of reducing power consumption in memory, and more particularly to systems and methods for limiting power consumption of wordlines in a memory bank.

II. Description of Related Art

Advances in technology have resulted in smaller and more powerful personal computing devices. For example, a variety of portable personal computing devices, including wireless computing devices, such as portable wireless telephones, personal digital assistants (PDAs), and paging devices are small, lightweight, and easily carried by users. More specifically, portable wireless telephones, such as cellular (analog and digital) telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can include a web interface that can be used to access the Internet. As such, these wireless telephones include significant computing capabilities.

Typically, portable computing devices are battery-powered. Consequently, the electronic circuits for the portable devices are often required to meet stringent energy requirements. Since the number of transistors on a chip continue to increase while the threshold voltages of these transistors continues to decrease, leakage energy via the transistors is becoming increasingly important.

Current microprocessors generally include dense cache memories that include numerous transistors. It has been estimated that leakage energy accounts for 30 percent of level 1 (L1) cache energy consumed by a 65 nm part in active operation mode and 80 percent of level 2 (L2) cache energy for a semiconductor device manufactured using a 0.13 micron process.

As the gap between processing frequencies and Dynamic Random Access Memory (DRAM) access times has continued to widen, semiconductor device manufacturers have increasingly utilized on-die Static Random Access Memory (SRAM) to meet performance requirements. Consequently, in many chips, the SRAM arrays may occupy as much as 60 percent of the die area. Since most of the SRAM circuit elements are idle at any given time, the SRAM arrays are significant sources of current leakage.

It has been proposed to gate the power supply to wordline logic along a memory addressable unit when the processor is in a special power-save mode, such as a sleep mode (where the SRAM state is restored on wakeup) or a stop mode (where the SRAM contents are invalidated). These modes are typically controlled by software and add to device complexity and overhead.

Accordingly, it would be advantageous to provide an improved power control mechanism for reducing current leakage for memory devices.

SUMMARY

In a particular embodiment, a method of reducing power consumption of a memory includes receiving a request to access a memory device. The memory device includes a decoder, a plurality of wordline drivers and a plurality of wordlines, where each wordline is associated with a wordline driver of the plurality of wordline drivers. The request is decoded in the decoder to determine an address associated with the request. A wordline driver of the plurality of wordline drivers is selectively powered to access the address of the memory device, but without powering other wordlines of the plurality of wordlines. The wordline driver is associated with a particular wordline that is related to the address associated with the request.

In a particular embodiment, selectively powering the wordline driver includes selectively enabling at least one of a head switch and a foot switch of the particular wordline to couple the wordline driver to a power supply. The head switch may include a p-channel transistor and the foot switch may include an n-channel transistor. In yet another particular embodiment, the method includes shutting off power to each of the plurality of wordline drivers of the memory device. In another embodiment, the wordline driver is selectively powered by selectively enabling a p-channel transistor of an inverter of the wordline driver to charge a local capacitance using a diffusion capacitance associated with the plurality of wordline drivers. In another embodiment, the wordline driver is selectively powered by charging a head switch and a foot switch from a supply capacitance and a local virtual ground, respectively. In one particular illustrative embodiment, the memory device is a static random access memory (SRAM). In another particular embodiment, the memory device is a cache memory, such as a level one or a level two cache memory.

In yet another particular embodiment, an electronic device is disclosed that includes a memory, a plurality of wordline drivers, and a decoder. The memory includes a plurality of wordlines. The plurality of wordline drivers is coupled to the memory, where each wordline driver is associated with a wordline of the plurality of wordlines of the memory. Power to each of the plurality of wordline drivers is off during a default state and is selectively powered during a wordline access period. The decoder is coupled to the plurality of wordline drivers to receive a memory access request and to decode the memory access request to determine an address associated with the memory access request. The decoder is adapted to power a selected wordline driver, but not other wordline drivers of the plurality of wordline drivers, in response to the request.

In a particular embodiment, the electronic device includes a power manager to selectively enable the selected wordline driver in response to determining the address associated with the memory access request. In another embodiment, the memory includes a plurality of memory banks, where each of the plurality of memory banks includes a pair of sub-banks, the pair of sub-banks to share pre-decode data. In yet another embodiment, each wordline driver includes a high voltage threshold (VT) transistor.

In still another particular embodiment, a processor readable medium embodying processor readable instructions to reduce power consumption of the processor is provided. The processor readable instructions include instructions to decode a memory access request to determine a memory address corresponding to a selected wordline of a memory and instructions to selectively power a wordline driver associated with the selected wordline without applying power to other wordlines in response to determining the memory address.

In yet another particular embodiment, a memory device includes storage means including a plurality of wordlines, means for decoding an address input to determine a memory address corresponding to a selected one of the plurality of wordlines, and means for powering the selected one of the plurality of wordlines, but not other wordlines of the plurality of wordlines, in response to determining the memory address. In still another particular embodiment, the memory device includes switching means to selectively couple the means for decoding to a power supply terminal.

In one particular embodiment, a portable device includes a display controller, an input interface to receive user inputs, a transceiver to receive digital signals, and a digital signal processor. The digital signal processor is coupled to the transceiver, to the input interface, and to the display controller. The digital signal processor includes a random access memory including a plurality of wordlines and a decoder to decode a memory access request to determine a wordline associated with the memory access request. The digital signal processor includes a power manager to selectively power the wordline, without applying power to other wordlines of the plurality of wordlines.

One particular advantage of a particular illustrative embodiment, is that the introduction of a head switch and a foot switch may reduce leakage current through a wordline driver by about 20× over a conventional wordline driver during both active and non-active operational modes.

Another particular advantage is that over-all power consumption by the memory is reduced without increasing performance overhead. This reduction in power consumption provides an additional advantage in that power is conserved for use in other processes and/or to extend an operational life of a power source, such as a battery.

In yet another aspect, a particular advantage of an illustrative embodiment is that the diffusion capacitance of the wordline driver p-channel transistors is greater than the wordline capacitance, allowing the local capacitance across the transistor to be distributed through charge sharing. This reduces the effect of the head switch on the wordline delay, making it possible to utilize small head/foot switches.

Other aspects, advantages, and features of the present disclosure will become apparent after review of the entire application, including the following sections: Brief Description of the Drawings, Detailed Description, and the Claims.

BRIEF DESCRIPTION OF THE DRAWINGS

The aspects and the attendant advantages of the embodiments described herein will become more readily apparent by reference to the following detailed description when taken in conjunction with the accompanying drawings wherein.

DETAILED DESCRIPTION

Figure 1:
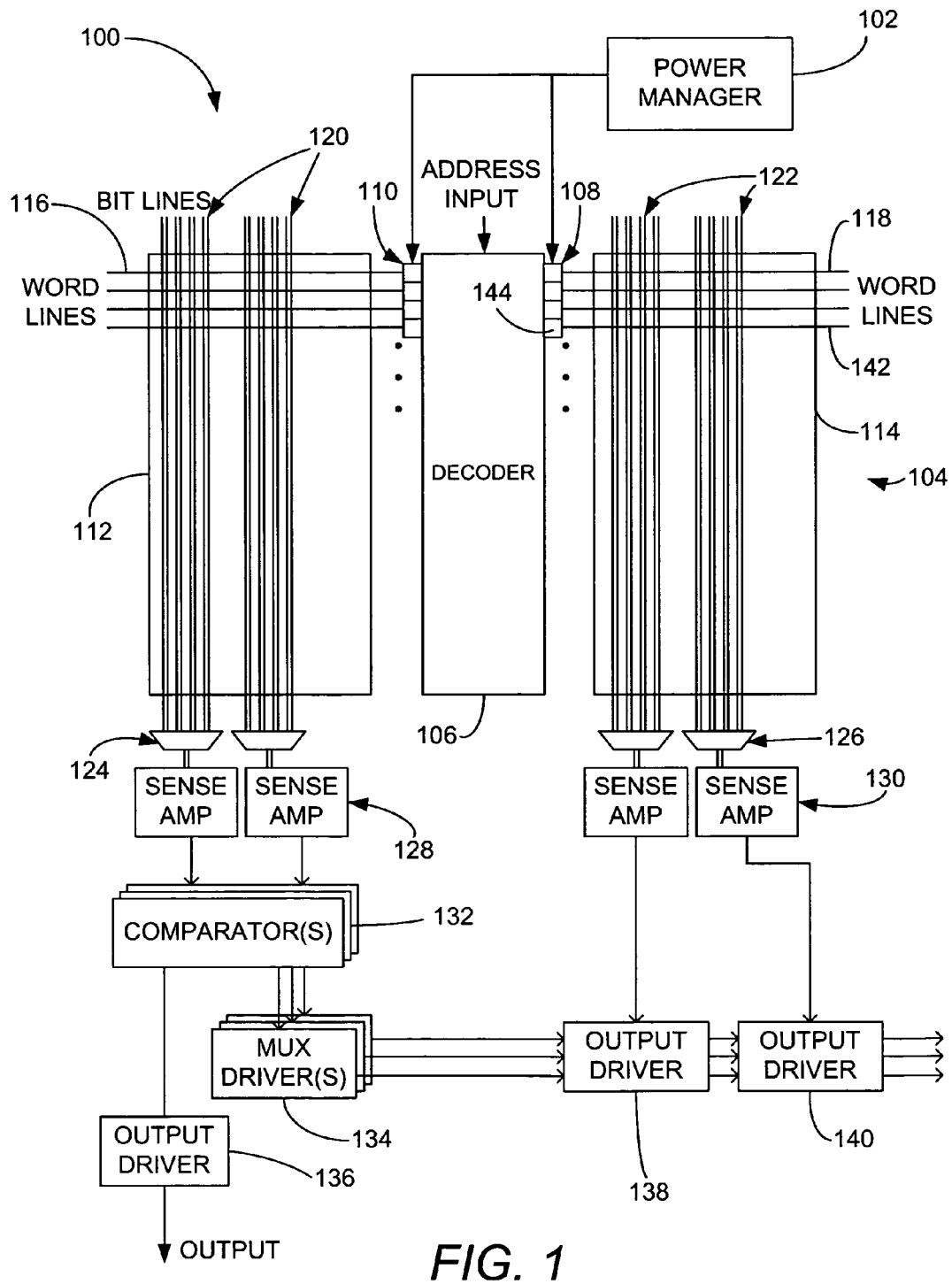
FIG. 1 is a block diagram illustrating a particular embodiment of a structure with a power manager to selectively power one wordline, but not other wordlines of memory.

FIG. 1 is a block diagram illustrating a particular embodiment of a structure 100 having a power manager to selectively power one wordline, but not other wordlines, of the memory, such as a cache memory. The structure 100 includes a power manager 102, a cache memory array 104, a decoder 106, and wordline drivers 108 and 110. The cache memory array 104 is subdivided into two representative memory banks 112 and 114. Each bank 112 and 114 includes a plurality of word lines 116 and 118, respectively. Each bank 112 and 114 also includes a plurality of bit lines 120 and 122, respectively. The structure 100 also includes multiplexers 124 and 126, sense amplifiers 128 and 130, comparators 132, multiplexer (MUX) drivers 134, an output driver 136, and output drivers 138 and 140.

The power manager 102 includes logic to selectively enable and disable gating of power to the wordline drivers 108 and 110. The decoder 106 includes an input and a plurality of wordline outputs. Each wordline driver 108 and 110 includes an input coupled to the power manager 102, an input coupled to one of the plurality of wordline outputs of the decoder 106, and an output coupled to a wordline of one of the banks 112 or 114. Each wordline driver 108 and 110 also includes a clock input (shown in FIG. 2) to receive a clock signal. It should be understood that the wordline drivers 108 and 110 may be included in the decoder 106.

The multiplexers 124 and 126 include inputs connected to the bit lines 120 and 122, respectively. The multiplexers 124 and 126 also include outputs. Sense amplifiers 128 and 130 are connected to the outputs of multiplexers 124 and 126. A comparator circuit 132 includes an input connected to the output of the sense amplifier 128 and includes a plurality of outputs. The comparator circuit 132 may include a plurality of comparators. A multiplexer (MUX) driver 134 includes inputs connected to at least one of the plurality of outputs of the comparator circuit 132 and includes a plurality of outputs. An output driver 136 includes an input coupled to at least one of the plurality of outputs of the comparator circuit 132, and includes an output. An output driver 138 includes a plurality of inputs coupled to the plurality of outputs of the MUX driver 134, an input coupled to an output of one of the sense amplifiers 130, and a plurality of outputs. An output driver 140 includes a plurality of inputs coupled to the plurality of outputs of the output driver 138, an input coupled to an output of one of the sense amplifiers 130, and a plurality of outputs.

In operation, the decoder 106 receives a memory access request, such as a memory address input for a memory read or write operation. The decoder 106 decodes the memory access request to determine a memory address of the memory 104 corresponding to the memory address input. When a matching address is found, the decoder 106 asserts a wordline 108 or 110 corresponding to the memory address. The power manager 102, in response to the decoder output, selectively enables power to the selected wordline based on the memory address.

For example, if the wordline 142 of the memory bank 114 is asserted, the power manager 102 selectively enables power to the specific wordline driver 144 associated with the wordline 142. The data bits of the wordline 142 are received by the multiplexers 126. The multiplexers 126 produce outputs, which are received by the sense amplifiers 130. The outputs of the sense amplifiers are provided to associated output drivers 138 and 140 to produce an output signal related to the data provided by the wordline 142.

Since only one wordline of the set of wordlines 116 and 118 is active in any given clock cycle, power to the wordline drivers 108 and 110 is turned off, except for power to the particular wordline driver 144 that is associated with the wordline 142 to be accessed. This power management function may be performed during normal operation at a hardware level, without entering into special power saving processor modes.

It should be understood that FIG. 1 is provided for illustrative purposes only and is not intended to be limiting. Moreover, while the memory structure is indicated to be a cache architecture, embodiments of the present invention apply to other memory structures, including static random access memory (SRAM), dynamic RAM, and the like. Additionally, though the set of wordline drivers 108 and 110 are shown as individual blocks coupled to a single memory bank, each wordline driver of the wordline drivers 108 and 110 may be coupled to a pair of memory banks and the power manager 102 may be adapted to selectively enable a selected individual wordline driver to provide power to one wordline of one of the memory banks at any given time.

Figure 2:
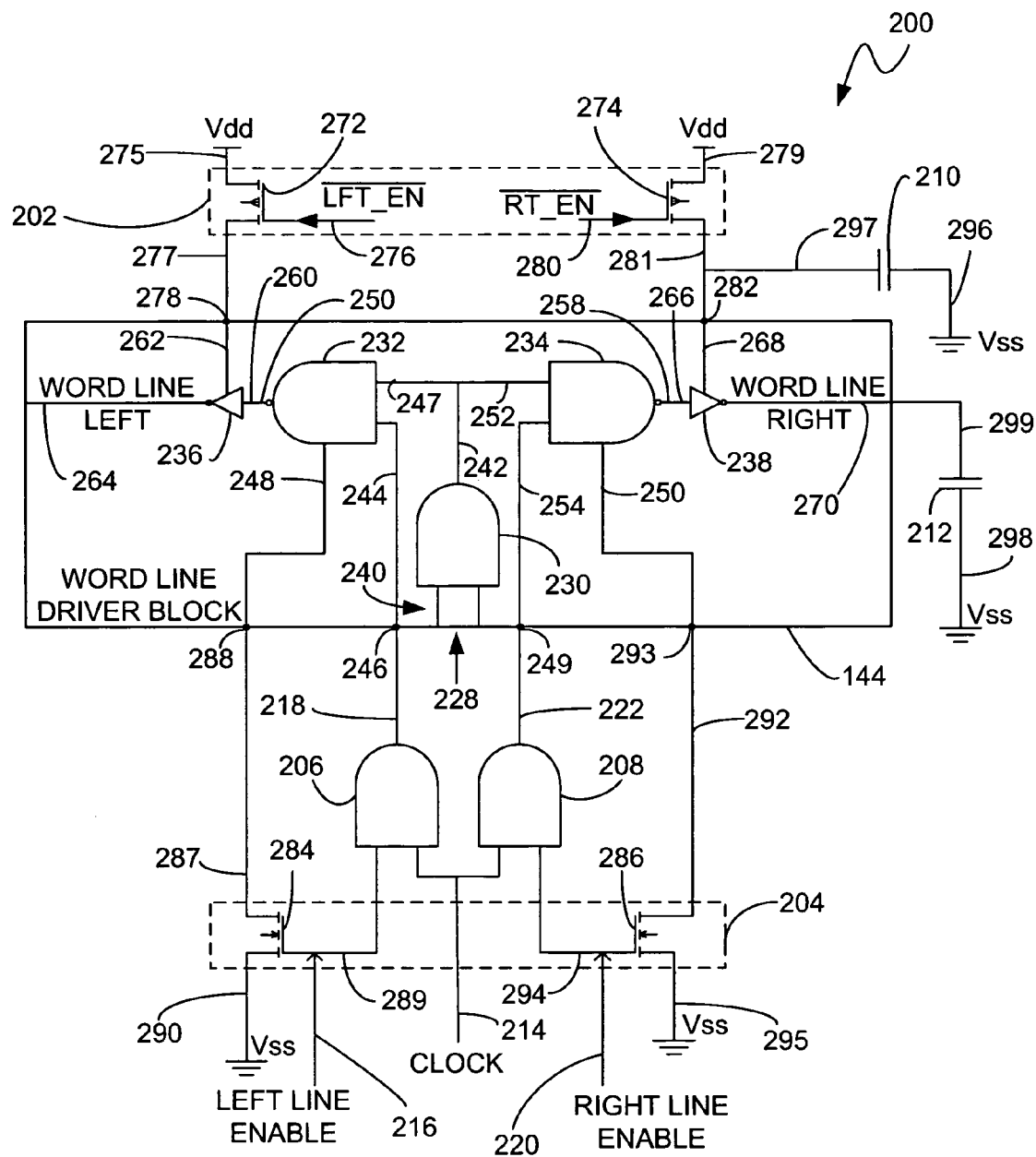
FIG. 2 is a logic diagram illustrating a particular embodiment of gate-level wordline logic including a head switch and a foot switch responsive to a power manager, such as the power manager of FIG. 1.

FIG. 2 is a logic diagram illustrating a particular embodiment of gate-level wordline logic 200 including a head switch 202 and a foot switch 204 responsive to a power manager, such as the power manager 102 of FIG. 1. Additionally, the wordline logic 200 includes a wordline driver block 144, AND logic gates 206 and 208 and capacitors 210 and 212. The AND logic gate 206 includes a clock input 214, a left line enable input 216, and an output 218. The AND logic gate 208 includes the clock input 214, a right line enable input 220, and an output 222. The wordline driver block 144 includes a left wordline input 246 coupled to the output 218 of the AND logic gate 206, a right wordline input 249 coupled to the output 222 of the AND logic gate 208, and a pair of inputs 228 coupled to a decoder to receive pre-decode data.

The wordline driver block 144 includes an AND logic gate 230, NAND logic gates 232 and 234, and inverters 236 and 238. The AND logic gate 230 includes a pair of inputs 240 connected to the pair of inputs 228, and an output 242. The NAND logic gate 232 includes an input 244 connected to the output 218 of the AND logic gate 206 via node 246, an input 247 connected to the output 242 of the AND logic gate 230, a power input 248, and an output 250. The NAND logic gate 234 includes an input 252 connected to the output 242 of the AND logic gate 230, an input 254 connected to the output 222 of the AND logic gate 208 via node 249, a power input 250, and an output 258. The inverter 236 includes an input 260 connected to the output 250 of the NAND logic gate 232, a power input 262, and an output 264 coupled to a wordline of a left memory bank. The inverter 238 includes an input 266 connected to the output 258 of the NAND logic gate 234, a power input 268, and an output 270 coupled to a wordline of a right memory bank. It should be understood that the terms "left" and "right" are used for explanatory purposes only, and that the wordline driver block may be adapted to access any wordline.

The head switch 202 includes a p-channel transistor 272 and a p-channel transistor 274. The p-channel transistors 272 and 274 may be high voltage threshold (VT) transistors. The p-channel transistor 272 includes a first terminal 275 coupled to a supply voltage terminal (Vdd), a control terminal 276, and a second terminal 277 connected to the power input 262 of the inverter 236 via virtual supply node 278. The p-channel transistor 274 includes a first terminal 279 coupled to a supply voltage terminal (Vdd), a control terminal 280, and a second terminal 281 connected to the power input 268 of the inverter 238 via a virtual supply node 282. The foot switch 204 includes an n-channel transistor 284 and an n-channel transistor 286. The n-channel transistors 284 and 286 may be high voltage threshold (VT) transistors. The n-channel transistor 284 includes a first terminal 287 coupled to the power input 248 of the NAND logic gate 232 via virtual ground node 288, a control terminal 289 connected to the left line enable input 216, and a second terminal 290 coupled to a supply voltage terminal (Vss). The n-channel transistor 286 includes a first terminal 292 connected to the power input 250 of the NAND logic gate 234 via virtual ground node 293, a control terminal 294 connected to the right line enable input 220, and a second terminal 295 coupled to the supply voltage terminal (Vss). The capacitor 210 includes a first terminal 296 connected to the power supply voltage terminal (Vss) and a second terminal 297 connected to the second terminal 281 of the p-channel transistor 274. The capacitor 212 includes a first terminal 298 connected to the supply voltage terminal (Vss) and a second terminal 299 connected to the output 270 of the inverter 238.

During operation, a power manager (such as the power manager 102 in FIG. 1) provides a line enable signal, such as a left line enable signal via the left line enable input 216 or a right line enable signal via the right line enable input 218. If the line enable signal is a left line enable signal, for example, the n-channel transistor 284 receives the left line enable signal from the left line enable input 216 via the control terminal 289, which activates the n-channel transistor 284 to draw current to power the NAND logic gate 232. An inverse of the left line enable signal 216 is provided to the control terminal 276 of the p-channel transistor 272, thereby enabling current flow through the transistor 272 to the inverter 236. The AND logic gate 206 performs a logical AND operation on the left line enable signal and the clock signal from the left line enable input 216 and the clock input 214, respectively. Precode data is provided to the AND logic gate 230 via inputs 228. The precode data and the left-line enable signal are provided to the NAND logic gate 232 to power the left wordline via the inverter 236.

In general, capacitors, such as the capacitor 210, may be connected to the second terminal 281 of the p-channel transistor 274 to stabilize the input supply voltage to the inverter 238 via power input 268 when the p-channel transistor 274 is enabled. Similarly, a capacitor (not shown) may be added to the second terminal 277 of the p-channel transistor 272 to stabilize a supply voltage to the inverter 236 via power input 262, when the p-channel transistor 272 is enabled. Additionally, a capacitor, such as capacitor 212 may be provided on the output 270 of the inverter 238 (or on the output 264 of the inverter 236) to stabilize the output voltage to power the wordline of the memory.

In general, each word line of the memory bank may include wordline logic 200. When the memory array of the memory bank is not being accessed, power to all of the wordlines is turned off. On a read or a write access operation, a memory bank is selected by decoding the index bits, which are part of the address bits of a request associated with the access operation. Based on the memory request, one of the wordlines is asserted.

The head switch 202 and the foot switch 204 include high voltage threshold transistors to reduce current leakage. In general, the control signals, left line enable (lft_en) and right line enable (lrt_en), are existing signals utilized for memory sub-bank selection. Since only one wordline is activated per bank, the amount of active current on both the Vdd and the Vss supply terminals to drive the wordline driver 200 is small.

Additionally, the virtual ground and supply nodes have a relatively large capacitance compared to the wordline. Consequently, the amount of charge needed by the head/foot switches 202 and 204 during the short wordline switching period is small. This limits speed degradation due to the respective series transistor, since the charge comes from the local virtual ground or supply capacitance.

Due to the high ratio of diffusion-to-gate capacitance in advanced processes, the virtual supply nodes (Vdd and Vss) (the nodes between the head switches and the wordline p-channel transistor), is the diffusion capacitance of all of the wordline driver p-channel transistors. The diffusion capacitance of the wordline driver p-channel transistors is as follows:

$$C_{local} = 64 \cdot 10 \cdot C_{diff} \qquad \text{(Equation 1)}$$

Substituting $C_{diff}=0.8$ fF/μm, the local capacitance is approximately 512 fF. The local capacitance is significantly greater than the wordline capacitance of 62 fF, described above with respect to equation 1. During switching of the wordline, the p-channel transistor of the inverter turns on and the 8 to 1 ratio of the capacitance allows the charge in $C_{local}$ to be distributed through charge sharing. This has the advantage of reducing the effect on the wordline speed of a wordline delay, making it possible to use small head switches 202 and foot switches 204.

By utilizing high VT transistors in the head switch 202 and the foot switch 204 in the last stage of the wordline logic, the leakage current is limited. Consequently, other logic devices including the NAND logic gates 232, 234 and the inverters 236 and 238, may utilize low VT transistors to compensate for speed loss. Simulations have demonstrated that with a representative 65 nm process, the wordline logic of FIG. 2 can be implemented without introducing significant additional gate delays. However, the high VT transistors of the head switch 202 and the foot switch 204 substantially reduce the leakage current, by about 20×, as compared to the leakage current of conventional wordline driver circuits.

Figure 3:
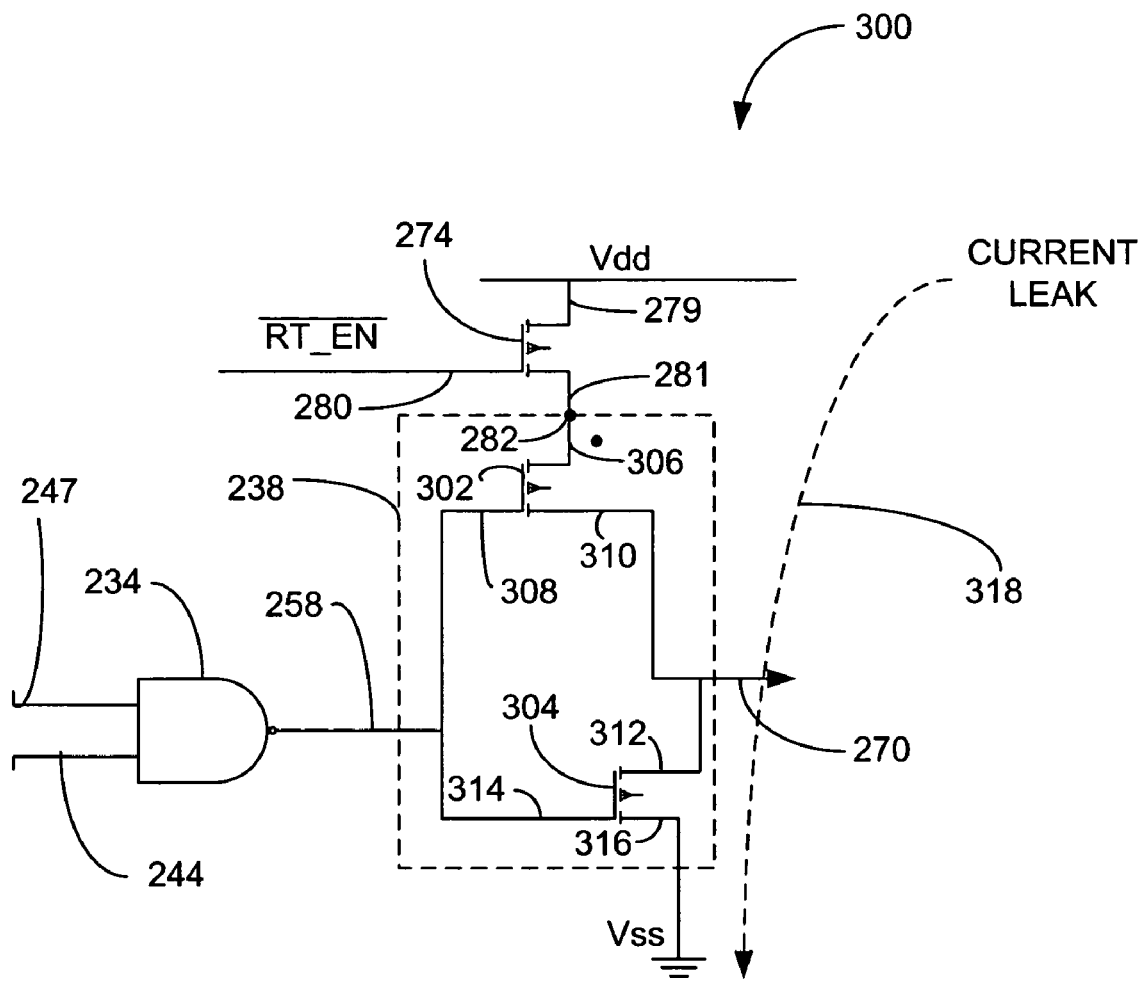
FIG. 3 is an expanded view of a portion of the logic diagram of FIG. 3.

FIG. 3 is an expanded view of a portion 300 of the logic diagram of FIG. 2. The portion 300 includes the p-channel transistor 274, the inverter 238, and the NAND logic gate 234. The p-channel transistor 274 has a first terminal 279 connected to a power supply voltage terminal (Vdd), a control terminal 280 to receive a right wordline enable signal, and a second terminal 281. The inverter 238 includes a low VT transistor 302 and a low VT transistor 304. The low VT transistor 302 includes a first terminal 306 connected to the second terminal 281 of the high VT transistor 274, a control terminal 308, and a second terminal 310. The NAND logic gate 234 includes a first input 244, a second input 247, and an output 258 connected to the control terminal 308 of the transistor 302. The low VT transistor 304 includes a first terminal 312 connected to the second terminal 310 of the low VT transistor 302, a control terminal 314 connected to the output 258 of the NAND logic gate 234, and a second terminal 316 connected to a supply voltage terminal (Vss).

In operation, current generally leaks through the low VT transistors as indicated by arrow 318. However, the p-channel transistor 274 inhibits current flow when the power is turned off. Since the power manager turns off power to the wordline driver via the transistor 274, for example, the overall power consumption is reduced by reducing current leakage through inactive transistors.

In general, whenever a particular wordline driver of the set of wordline drivers 108 or 110 is receiving power, current may leak through the wordline driver due to the low voltage threshold of transistors within the driver. The term voltage threshold refers to a threshold turn-on voltage level at which the transistor transitions from an inactive state to an active state. In particular, current flow through the transistor increases from a quiescent current level (measured in nano-amperes) to an active current level, which may conduct at much higher current levels. Accordingly, a simplified sub-threshold current equation may read as follows:

$$I_{ds} = I_{ds0} e^{\left[\frac{V_g - V_t}{nV_t}\right]} \left[1 - \frac{1}{e^{\frac{V_{ds}}{V_t}}}\right], \qquad \text{(Equation 2)}$$

where the variable $I_{ds0}$ represents a leakage current at the voltage threshold as follows:

$$I_{ds0} = \mu \frac{W}{l} \phi v_t^2 e^{1.8}, \qquad \text{(Equation 3)}$$

where μ is the effective carrier mobility, W/l is a device width to length ratio, φ is a process dependent constant, and $$V_t = \frac{kT}{q}$$

is the thermal voltage (approximately 26 mV at 300° Kelvin.

In general, the head switch 202 and the foot switch 204 may utilize high voltage threshold (VT) transistors. A high VT transistor refers to a device that has a high gate threshold, such that the transistor presents a high impedance to the voltage supply. In transistors, the leakage current increases exponentially with decreasing threshold voltage ($V_t$). Additionally, the leakage current scales linearly with transistor width (w) and with the reciprocal of channel length (L). By selectively powering individual wordlines during a short time period when the wordline is accessed, leakage current is significantly reduced.

For example, a particular embodiment of a memory may be a single ported 32 Kilobyte (KB) static random access memory (SRAM). The SRAM can be divided into 16 banks, and each bank can be divided into two sub-banks, using the wordline logic, such as that shown in FIG. 3. The wordline logic 200 shares pre-decode data, and differs from conventional logic in the last stage. Given a gate capacitance ($C_{nfet}$) of one n-channel transistor in the SRAM, it should be understood that the access devices for each cell of the memory adds a capacitive load of $C_{nfet}*2$ to the wordline. The wire capacitance per cell is approximately equal to one transistor capacitance, based on an estimate for wide 6T SRAM cells designed to be less than 90 nm and where the aspect ratio of the cell is close to two with the bit-line direction being the shorter side. Accordingly, each cell contributes a total of $3C_{nfet}$ capacitance to the wordline.

In general, the wordline logic can be sized to reduce delays using a theory of logical effort, which suggest that for a reduced delay on any given path, devices should be sized so that each stage sees a stage effort of 4. For a memory block with $2^n$ wordlines and $2^m$ bit-lines, the final inverter on the wordline logic, such as inverter 236, should have an input capacitance as follows:

$$\text{wordline input cap} = \frac{2m \cdot (3 \cdot Cnfet)}{4}. \quad \text{(Equation 4)}$$

In one embodiment, with n=6 and m=7, each SRAM sub-bank is approximately 1 KB, and the wordline input capacitance is approximately 62 fF. For this implementation, the wordline inverter total width can be calculated, using equation 4, to be $96C_{nfet}$. The passgate is a reduced size with a long channel for improved read stability, and $C_{nfet}$ is approximately 0.15 fempto-Farads (fF). The input capacitance on the inverter that actually drives the wordline (e.g. inverter 236 for the wordline left) is 96·0.15 fF≈0.15 fF. The gate capacitance in 65 nm technologies is of an order of approximately 1 fF/μm, so the total size of the wordline driver 200 may be approximately 15 μm. Assuming holes have roughly half the mobility of electrons and assuming that equal rise time and fall time are desirable, a head switch may be designed using a p-channel transistor having a width of 10 μm and a width of approximately 5 μm, such as the p-channel transistor 304 of FIG. 3.

Using a representative device with low, normal and high voltage threshold transistors, the leakage per μm of gate width for a p-channel transistor can be referred to as L nA/μm, where the value of L depends on the process technology and on the process, voltage and temperature points. A 6-T transistor cell may be designed such that the devices within the cell are minimum width devices for a given process technology. The devices may have longer channel length and higher threshold implant, which makes the leakage very small. The leakage can be referred to as L pA/per cell. For a 2 KB bank, the total leakage current of all the wordline drivers and array cells would as follows:

$$I_{wl\_leak} = 10\,\mu \cdot 2^6 \cdot L(nA) = 1.28 \cdot L(\mu A), \text{ and} \quad \text{(Equation 5)}$$

$$I_{SRAM\_leak} = 2 \cdot 2^6 \cdot 2^7 \cdot L_s = 0.016384 \cdot L_s(\mu A) \quad \text{(Equation 6)}$$

In general, the wordline driver leakage for different values of L are provided in table 1.

TABLE 1

| Wordline Pfet size (μm) | Number of wordline drivers per memory bank | Total pfet width | Leakage per μm (na/μm) | Total Leakage (μA) per bank | Total Leakage of wordline for 32 KB μA | Power with 1.2 V Supply (μW) |
|---|---|---|---|---|---|---|
| 10 | 128 | 1280 | 0.3 | 0.384 | 6.144 | 7.3728 |
| 10 | 128 | 1280 | 3 | 3.84 | 61.44 | 73.728 |
| 10 | 128 | 1280 | 30 | 38.4 | 614.4 | 737.28 |

Table 2 shows an example of SRAM array leakage for different values of L.

TABLE 2

| Number of SRAM cells in 2 KB | Leakage per SRAM cell pA | Total leakage of SRAM cell for 32 KB (μA) | Total leakage of SRAM array for 32 KB (μA) | Power for 1.2 V Supply (μW) |
|---|---|---|---|---|
| 16384 | 20 | 0.32768 | 5.24288 | 6.291456 |
| 16384 | 200 | 3.2768 | 52.4288 | 62.91456 |
| 16384 | 500 | 8.192 | 131.072 | 157.2864 |

Tables 1 and 2 illustrate the leakage current of a wordline driver to the array, and the values of L and $L_s$ correspond to three operating points of power, voltage and temperature. The leakage power is computed assuming a 1.2 volt power supply, which is common for 65 nm processes. In each case, wordline logic leakage current is greater than the leakage current from all the 6-T cells in the memory array.

This reduction can be accounted for because the high VT transistors reduce leakage exponentially, as demonstrated by Equation 2 above. Leakage current is limited by the width of the head switch 202. Moreover, the presence of stacked transistors also reduces leakage.

In general, the leakage power saved from the final inverter can be determined by calculating the total width of the head switch, which is only 48 μm. Assuming the high VT transistor leakage is approximately 10× less than a normal VT transistor, then the leakage savings ($I_{reduce}$), without accounting for the transistor stacking effect, may be calculated by using the ratio of the leakage current per micrometer and the effective width of the final driver in both designs as follows:

$$\theta = \frac{I_{NVT\_leak\_per\_\mu} \cdot W_{eff\_orig}}{I_{HVT\_leak\_per\_\mu} \cdot W_{eff\_new}} \quad \text{(Equation 7)}$$

Substituting into equation 7 the leakage current ratio of 10, a ratio of the effective width is $$\frac{W_{eff\_orig}}{W_{eff\_new}} = \frac{1280}{48} = 26.7,$$

then θ=10·26.7=267.

The leakage current from the final inverter of the wordline logic can be reduced substantially. In simulations on a 2 KB block with conventional wordline logic as compared to the wordline logic of FIG. 2, the low power wordline logic shows a total reduction of leakage current of approximately 20×. The exact amount of leakage savings depends on the leakage of the high VT transistor, the memory access pattern, and the bank selection process. In an active mode, even for worst case SRAM access patterns, the leakage power savings more than compensates for the increased power consumption from the addition of the head and foot switches for a 32 KB SRAM.

Table 3 below shows an example of a worst case active power added due to one bank head/foot switch being active.

TABLE 3

| Head Switch Size (μm) | Foot Switch Size (μm) | Total Gate Capacitance of Head and Food (fF) | Voltage | Power $C*V^2*AF$ (μW/GHz) |
|---|---|---|---|---|
| 48 | 24 | 57.6 | 1.2 | 41.472 |

Comparing the values of Table 3 with the value for the wordline leakage from Table 1 on the other 15 inactive banks of a 16 bank memory demonstrates that the power savings more than compensates for the increase in active power due to the additional devices. When a part is active, the junction temperature increases and wordline leakage tends toward the worst case leakage of 614.4 μA in table 1.

Figure 4:
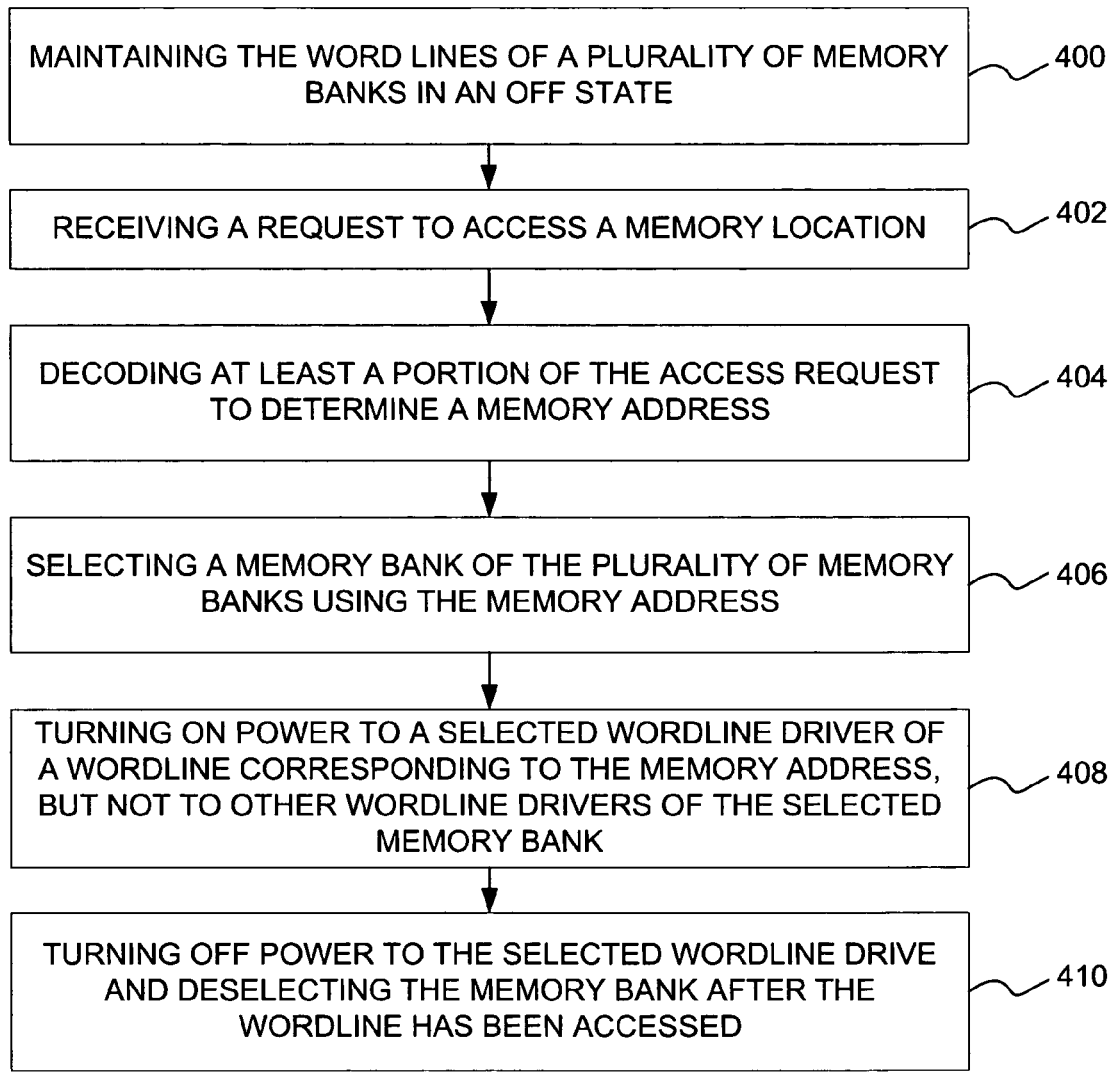
FIG. 4 is a flow diagram illustrating a particular embodiment of a method of reducing leakage current consumption by selectively powering individual wordlines.

FIG. 4 is a flow diagram illustrating a particular embodiment of a method of reducing leakage current consumption by selectively powering individual wordlines. Wordlines of a plurality of memory banks are maintained in an Off-state (block 400). A request to access a memory location is received (block 402). At least a portion of the memory access request is decoded to determine a memory address (block 404). A memory bank of the plurality of memory banks is selected using the memory address (block 406). The power is turned on to a selected wordline driver of a wordline corresponding to the memory address without turning on power to other wordline drivers of the selected memory bank (block 408). Power is turned off to the selected wordline driver and the memory bank is deselected after the wordline has been accessed (block 410).

Figure 5:
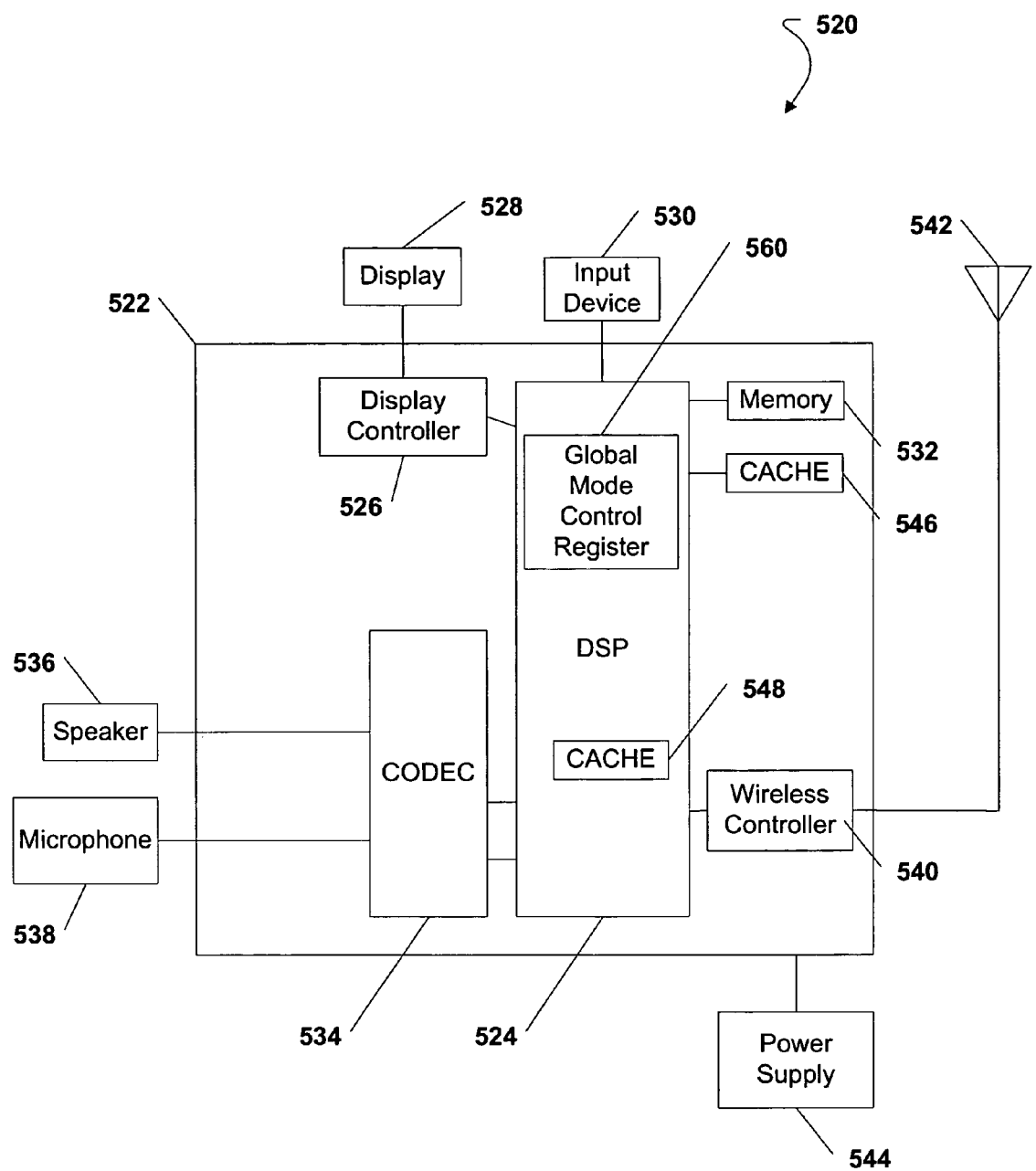
FIG. 5 is a general diagram of a portable communication device incorporating a memory in which the reduced power consumption system and method of FIGS. 1-4 may be used.

FIG. 5 illustrates an exemplary, non-limiting embodiment of a portable communication device that is generally designated 520. As illustrated in FIG. 5, the portable communication device includes an on-chip system 522 that includes a digital signal processor 524. FIG. 5 also shows a display controller 526 that is coupled to the digital signal processor 524 and a display 528. Moreover, an input device 530 is coupled to the digital signal processor 524. As shown, a memory 532 and a cache 546 are coupled to the digital signal processor 524. Additionally, the digital signal processor 524 may include a cache 548. Additionally, a coder/decoder (CODEC) 534 can be coupled to the digital signal processor 524. A speaker 536 and a microphone 538 can be coupled to the CODEC 530.

In general, the memory 532, the cache 546, and the cache 548 may include the wordline logic of FIGS. 1-3 and may utilize the power saving method of FIG. 4. The caches 546 and 548 may be level one cache, level two cache, and the like. In one particular embodiment, the cache 546 is a level two cache and the cache 548 is a level one cache.

FIG. 5 also indicates that a wireless controller 540 can be coupled to the digital signal processor 524 and a wireless antenna 542. In a particular embodiment, a power supply 544 is coupled to the on-chip system 502. Moreover, in a particular embodiment, as illustrated in FIG. 5, the display 526, the input device 530, the speaker 536, the microphone 538, the wireless antenna 542, and the power supply 544 are external to the on-chip system 522. However, each is coupled to a component of the on-chip system 522.

In a particular embodiment, the digital signal processor 524 utilizes interleaved multithreading to process instructions associated with program threads necessary to perform the functionality and operations needed by the various components of the portable communication device 520. For example, when a wireless communication session is established via the wireless antenna a user can speak into the microphone 538. Electronic signals representing the user's voice can be sent to the CODEC 534 to be encoded. The digital signal processor 524 can perform data processing for the CODEC 534 to encode the electronic signals from the microphone. Further, incoming signals received via the wireless antenna 542 can be sent to the CODEC 534 by the wireless controller 540 to be decoded and sent to the speaker 536. The digital signal processor 524 can also perform the data processing for the CODEC 534 when decoding the signal received via the wireless antenna 542.

Further, before, during, or after the wireless communication session, the digital signal processor 524 can process inputs that are received from the input device 530. For example, during the wireless communication session, a user may be using the input device 530 and the display 528 to surf the Internet via a web browser that is embedded within the memory 532 of the portable communication device 520. The digital signal processor 524 can interleave various program threads that are used by the input device 530, the display controller 526, the display 528, the CODEC 534 and the wireless controller 540, as described herein, to efficiently control the operation of the portable communication device 520 and the various components therein. Many of the instructions associated with the various program threads are executed concurrently during one or more clock cycles. As such, the power and energy consumption due to wasted clock cycles may be substantially decreased.

The DSP 524 further includes a global mode control register 560. The global mode control register can be used to control the execution mode of the interleaved threads. The execution mode for each thread can be a wait mode, an active mode, an off mode, a debug mode, or other appropriate mode.

Figure 6:
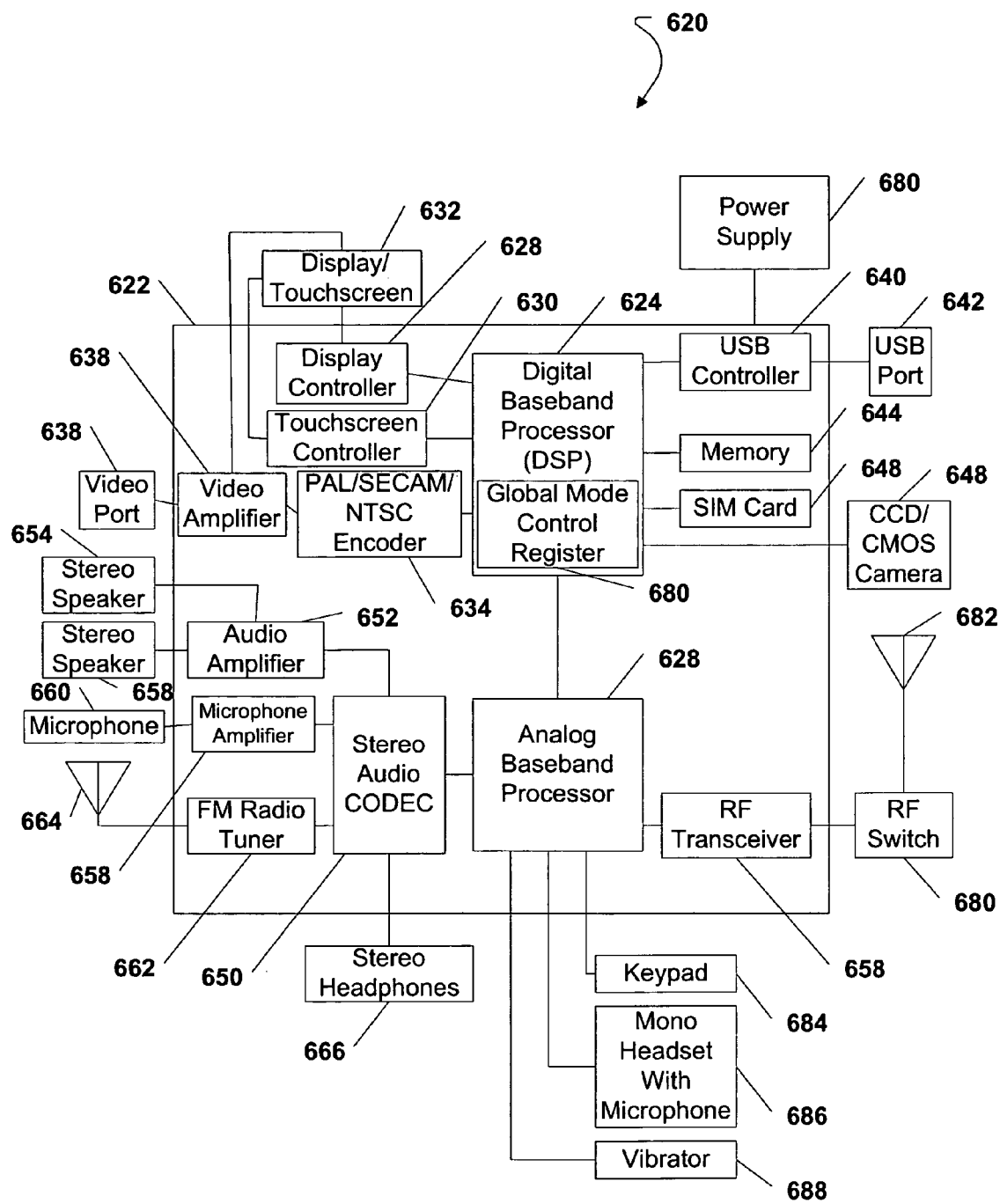
FIG. 6 is a general diagram of an exemplary cellular telephone incorporating a processor and a memory in which the reduced power consumption system and method of FIGS. 1-4 may be used.

Referring to FIG. 6, an exemplary, non-limiting embodiment of a cellular telephone is shown and is generally designated 620. As shown, the cellular telephone 620 includes an on-chip system 622 that includes a digital baseband processor 624 and an analog baseband processor 626 that are coupled together. In a particular embodiment, the digital baseband processor 624 is a digital signal processor. The digital signal processor includes a global mode control register 680 to control the execution modes for the threads of the digital signal processor. As illustrated in FIG. 6, a display controller 628 and a touchscreen controller 630 are coupled to the digital baseband processor 624. In turn, a touchscreen display 632 external to the on-chip system 622 is coupled to the display controller 628 and the touchscreen controller 630.

FIG. 6 further indicates that a video encoder 634, e.g., a phase alternating line (PAL) encoder, a sequential couleur a memoire (SECAM) encoder, or a national television system(s) committee (NTSC) encoder, is coupled to the digital baseband processor 624. Further, a video amplifier 636 is coupled to the video encoder 634 and the touchscreen display 632. Also, a video port 638 is coupled to the video amplifier 636. As depicted in FIG. 6, a universal serial bus (USB) controller 640 is coupled to the digital baseband processor 624. Also, a USB port 642 is coupled to the USB controller 640. A memory 644 and a subscriber identity module (SIM) card 646 can also be coupled to the digital baseband processor 624. The memory 644 may include the wordline logic of FIGS. 1-3 and may utilize the power saving method of FIG. 4.

Further, as shown in FIG. 6, a digital camera 648 can be coupled to the digital baseband processor 624. In an exemplary embodiment, the digital camera 648 is a charge-coupled device (CCD) camera or a complementary metal-oxide semiconductor (CMOS) camera.

As further illustrated in FIG. 6, a stereo audio CODEC 650 can be coupled to the analog baseband processor 626. Moreover, an audio amplifier 652 can coupled to the to the stereo audio CODEC 650. In an exemplary embodiment, a first stereo speaker 654 and a second stereo speaker 656 are coupled to the audio amplifier 652. FIG. 6 shows that a microphone amplifier 658 can be also coupled to the stereo audio CODEC 650. Additionally, a microphone 660 can be coupled to the microphone amplifier 658. In a particular embodiment, a frequency modulation (FM) radio tuner 662 can be coupled to the stereo audio CODEC 650. Also, an FM antenna 664 is coupled to the FM radio tuner 662. Further, stereo headphones 666 can be coupled to the stereo audio CODEC 650.

FIG. 6 further indicates that a radio frequency (RF) transceiver 668 can be coupled to the analog baseband processor 626. An RF switch 670 can be coupled to the RF transceiver 668 and an RF antenna 672. As shown in FIG. 6, a keypad 674 can be coupled to the analog baseband processor 626. Also, a mono headset with a microphone 676 can be coupled to the analog baseband processor 626. Further, a vibrator device 678 can be coupled to the analog baseband processor 626. FIG. 6 also shows that a power supply 680 can be coupled to the on-chip system 622. In a particular embodiment, the power supply 680 is a direct current (DC) power supply that provides power to the various components of the cellular telephone 620 that require power. Further, in a particular embodiment, the power supply is a rechargeable DC battery or a DC power supply that is derived from an alternating current (AC) to DC transformer that is connected to an AC power source.

In a particular embodiment, as depicted in FIG. 6, the touchscreen display 632, the video port 638, the USB port 642, the camera 648, the first stereo speaker 654, the second stereo speaker 656, the microphone, the FM antenna 664, the stereo headphones 666, the RF switch 670, the RF antenna 672, the keypad 674, the mono headset 676, the vibrator 678, and the power supply 680 are external to the on-chip system 622. Moreover, in a particular embodiment, the digital baseband processor 624 can use interleaved multithreading, described herein, in order to process the various program threads associated with one or more of the different components associated with the cellular telephone 620.

Figure 7:
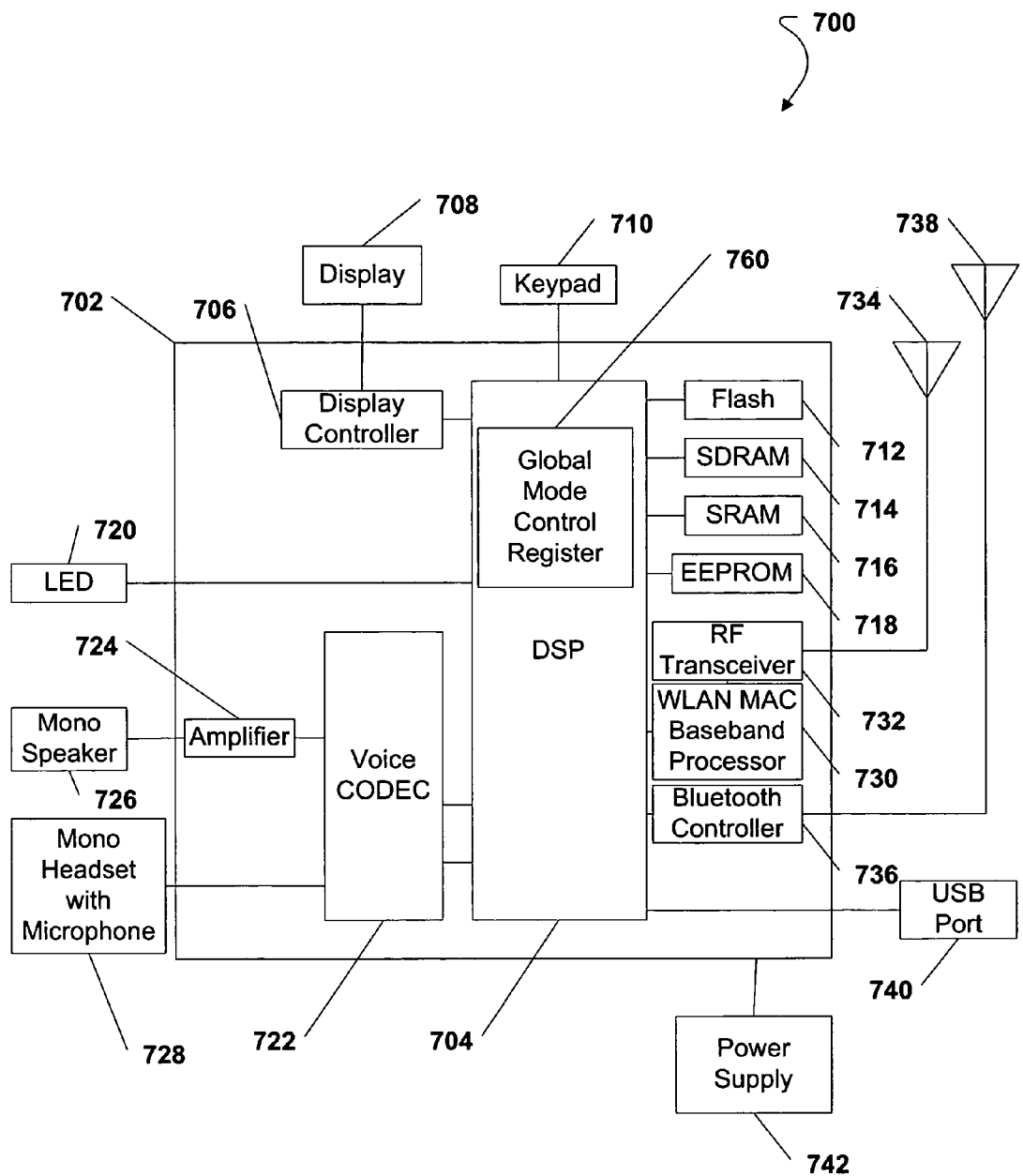
FIG. 7 is a general diagram of an exemplary wireless Internet Protocol telephone incorporating a processor and a memory in which the reduced power consumption system and method of FIGS. 1-4 may be used.

Referring to FIG. 7, an exemplary, non-limiting embodiment of a wireless Internet protocol (IP) telephone is shown and is generally designated 700. As shown, the wireless IP telephone 700 includes an on-chip system 702 that includes a digital signal processor (DSP) 704. The digital signal processor 704 includes a global model control register 760 to control the program threads of the processor. As illustrated in FIG. 7, a display controller 706 is coupled to the DSP 704 and a display 708 is coupled to the display controller 706. In an exemplary embodiment, the display 708 is a liquid crystal display (LCD). FIG. 7 further shows that a keypad 710 can be coupled to the DSP 704.

As further depicted in FIG. 7, a flash memory 712 can be coupled to the DSP 704. A synchronous dynamic random access memory (SDRAM) 714, a static random access memory (SRAM) 716, and an electrically erasable programmable read only memory (EEPROM) 718 can also be coupled to the DSP 704. The SDRAM 714 and the SRAM 716 may include the wordline logic of FIGS. 1-3 and may utilize the power saving method of FIG. 4.

FIG. 7 also shows that a light emitting diode (LED) 720 can be coupled to the DSP 704. Additionally, in a particular embodiment, a voice CODEC 722 can be coupled to the DSP 704. An amplifier 724 can be coupled to the voice CODEC 722 and a mono speaker 726 can be coupled to the amplifier 724. FIG. 7 further indicates that a mono headset 728 can also be coupled to the voice CODEC 722. In a particular embodiment, the mono headset 728 includes a microphone.

FIG. 7 also illustrates that a wireless local area network (WLAN) baseband processor 730 can be coupled to the DSP 704. An RF transceiver 732 can be coupled to the WLAN baseband processor 730 and an RF antenna 734 can be coupled to the RF transceiver 732. In a particular embodiment, a Bluetooth controller 736 can also be coupled to the DSP 704 and a Bluetooth antenna 738 can be coupled to the controller 736. FIG. 7 also shows that a USB port 740 can also be coupled to the DSP 704. Moreover, a power supply 742 is coupled to the on-chip system 702 and provides power to the various components of the wireless IP telephone 700 via the on-chip system 702.

In a particular embodiment, as indicated in FIG. 7, the display 708, the keypad 710, the LED 720, the mono speaker 726, the mono headset 728, the RF antenna 734, the Bluetooth antenna 738, the USB port 740, and the power supply 742 are external to the on-chip system 702. However, each of these components is coupled to one or more components of the on-chip system. Further, in a particular embodiment, the digital signal processor 704 can use interleaved multithreading, as described herein, in order to process the various program threads, including execution linked threads associated with two or more of the different components associated with the IP telephone 700.

Figure 8:
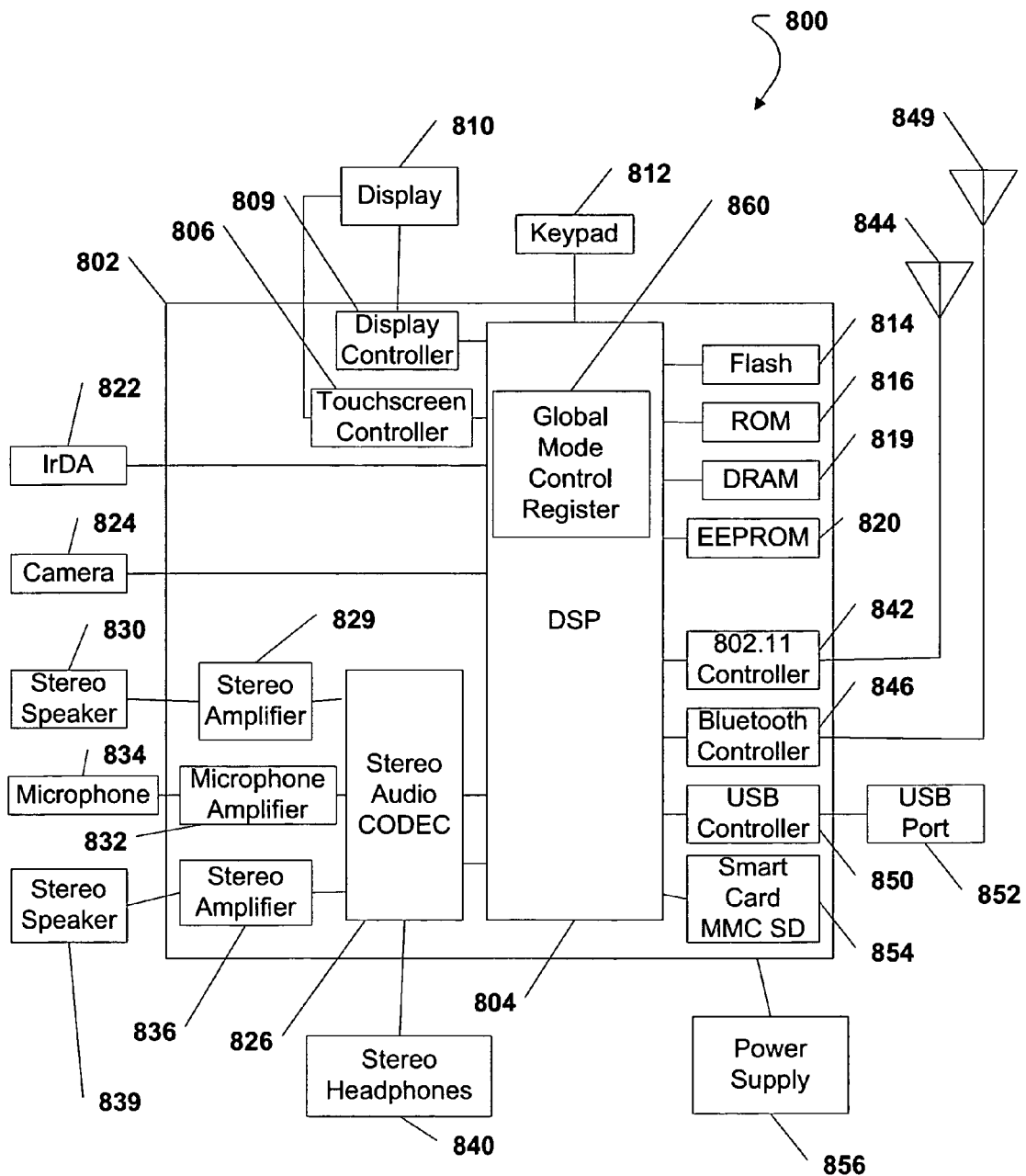
FIG. 8 is a general diagram of an exemplary portable digital assistant incorporating a processor and a memory in which the reduced power consumption system and method of FIGS. 1-4 may be used.

FIG. 8 illustrates an exemplary, non-limiting embodiment of a portable digital assistant (PDA) that is generally designated 800. As shown, the PDA 800 includes an on-chip system 802 that includes a digital signal processor (DSP) 804. The digital signal processor 804 includes a global mode control register 860 to control the program threads of the processor. As depicted in FIG. 8, a touchscreen controller 806 and a display controller 808 are coupled to the DSP 804. Further, a touchscreen display is coupled to the touchscreen controller 806 and to the display controller 808. FIG. 8 also indicates that a keypad 812 can be coupled to the DSP 804.

As further depicted in FIG. 8, a flash memory 814 can be coupled to the DSP 804. Also, a read only memory (ROM) 816, a dynamic random access memory (DRAM) 819, and an electrically erasable programmable read only memory (EEPROM) 820 can be coupled to the DSP 804. The DRAM 819, the flash memory 814, and other memory of the PDA 800 may include the wordline logic of FIGS. 1-3 and may utilize the power saving method of FIG. 4.

FIG. 8 also shows that an infrared data association (IrDA) port 822 can be coupled to the DSP 804. Additionally, in a particular embodiment, a digital camera 824 can be coupled to the DSP 804.

As shown in FIG. 8, in a particular embodiment, a stereo audio CODEC 826 can be coupled to the DSP 804. A first stereo amplifier 828 can be coupled to the stereo audio CODEC 826 and a first stereo speaker 830 can be coupled to the first stereo amplifier 828. Additionally, a microphone amplifier 832 can be coupled to the stereo audio CODEC 826 and a microphone 834 can be coupled to the microphone amplifier 832. FIG. 8 further shows that a second stereo amplifier 836 can be coupled to the stereo audio CODEC 826 and a second stereo speaker 838 can be coupled to the second stereo amplifier 836. In a particular embodiment, stereo headphones 840 can also be coupled to the stereo audio CODEC 826.

FIG. 8 also illustrates that an 802.11 controller 842 can be coupled to the DSP 804 and an 802.11 antenna 844 can be coupled to the 802.11 controller 842. Moreover, a Bluetooth controller 846 can be coupled to the DSP 804 and a Bluetooth antenna 848 can be coupled to the Bluetooth controller 846.

As depicted in FIG. 8, a USB controller 850 can be coupled to the DSP 804 and a USB port 852 can be coupled to the USB controller 850. Additionally, a smart card 854, e.g., a multimedia card (MMC) or a secure digital card (SD) can be coupled to the DSP 804. Further, as shown in FIG. 8, a power supply 856 can be coupled to the on-chip system 802 and can provide power to the various components of the PDA 800 via the on-chip system 802.

In a particular embodiment, as indicated in FIG. 8, the display 810, the keypad 812, the IrDA port 822, the digital camera 824, the first stereo speaker 830, the microphone 834, the second stereo speaker 838, the stereo headphones 840, the 802.11 antenna 844, the Bluetooth antenna 848, the USB port 852, and the power supply 850 are external to the on-chip system 802. However, each of these components is coupled to one or more components on the on-chip system. Additionally, in a particular embodiment, the digital signal processor 804 can use interleaved multithreading, described herein, in order to process the various program threads, including execution linked threads associated with two or more of the different components associated with the portable digital assistant 800.

Figure 9:
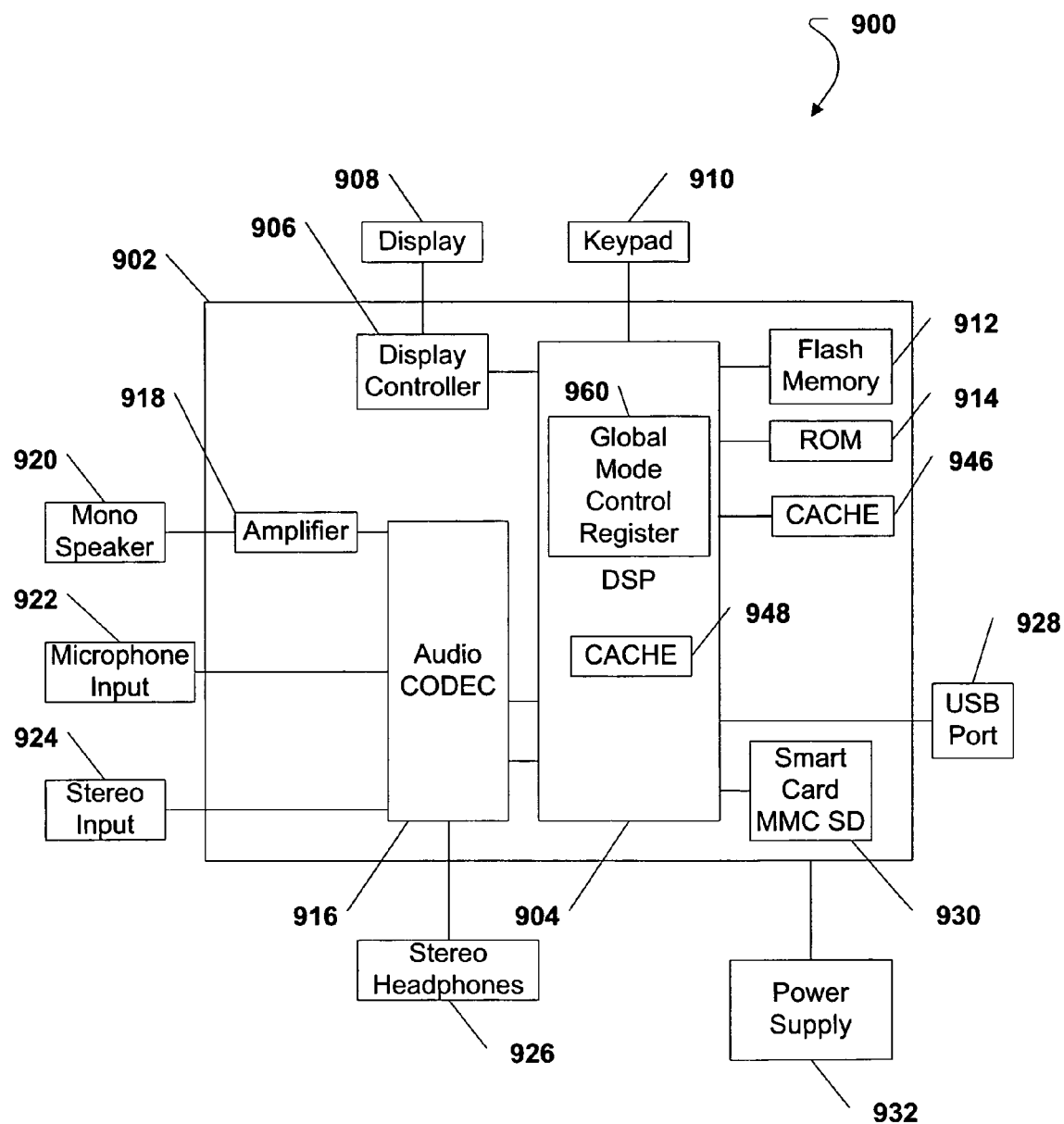
FIG. 9 is a general diagram of an exemplary audio file player incorporating a processor and a memory in which the reduced power consumption system and method of FIGS. 1-4 may be used.

Referring to FIG. 9, an exemplary, non-limiting embodiment of an audio file player, such as moving pictures experts group audio layer-3 (MP3) player is shown and is generally designated 900. As shown, the audio file player 900 includes an on-chip system 902 that includes a digital signal processor (DSP) 904. The DSP 904 includes a global mode control register 960 to control the program threads of the processor. As illustrated in FIG. 9, a display controller 906 is coupled to the DSP 904 and a display 908 is coupled to the display controller 906. In an exemplary embodiment, the display 908 is a liquid crystal display (LCD). FIG. 9 further shows that a keypad 910 can be coupled to the DSP 904.

As further depicted in FIG. 9, a flash memory 912 and a read only memory (ROM) 914 can be coupled to the DSP 904. Additionally, the MP3 player 900 may include a cache 946 coupled to the DSP 904 and a cache 948 within the DSP 904. The cache 946 may be a level two cache, while the cache 948 may be a level one cache. Moreover, the caches 946 and 948 and other memory within the audio player may include the wordline logic of FIGS. 1-3 and may utilize the power saving method of FIG. 4.

Additionally, in a particular embodiment, an audio CODEC 916 can be coupled to the DSP 904. An amplifier 918 can be coupled to the audio CODEC 916 and a mono speaker 920 can be coupled to the amplifier 918. FIG. 9 further indicates that a microphone input 922 and a stereo input 924 can also be coupled to the audio CODEC 916. In a particular embodiment, stereo headphones 926 can also be coupled to the audio CODEC 916.

FIG. 9 also indicates that a USB port 928 and a smart card 930 can be coupled to the DSP 904. Additionally, a power supply 932 can be coupled to the on-chip system 902 and can provide power to the various components of the audio file player 900 via the on-chip system 902.

In a particular embodiment, as indicated in FIG. 9, the display 908, the keypad 910, the mono speaker 920, the microphone input 922, the stereo input 924, the stereo headphones 926, the USB port 928, and the power supply 932 are external to the on-chip system 902. However, each of these components is coupled to one or more components on the on-chip system. Also, in a particular embodiment, the digital signal processor 904 can use interleaved multithreading, described herein, in order to process the various program threads, including execution linked threads associated with two or more of the different components associated with the audio file player 900.

With the configuration of structure disclosed herein, the system and method of controlling multiple threads in a multithreaded processor provides a way to place different program threads into different states. Further, the system and method can allow one thread to determine the state of another thread. The system and method can be used to control any number of program threads in the manner described herein.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in RAM memory, flash memory, ROM memory, PROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a computing device or a user terminal. In the alternative, the processor and the storage medium may reside as discrete components in a computing device or user terminal.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features as defined by the following claims.

What is claimed is:

1. An electronic device comprising:
   a memory including a plurality of wordlines, wherein the memory includes a plurality of memory banks, each of the plurality of memory banks including a pair of sub-banks, the pair of sub-banks to share pre-decode data;
   a plurality of wordline drivers coupled to the memory, each wordline driver associated with a wordline of the plurality of wordlines of the memory, wherein power to each of the plurality of wordline drivers is off during a default state, except during a wordline access period; and
   a decoder coupled to the plurality of wordline drivers to receive a memory access request and to decode the memory access request to determine an address associated with the memory access request, the decoder to power a selected wordline driver, but not power other wordline drivers of the plurality of wordline drivers, in response to the memory access request.

2. The electronic device of claim 1, wherein the memory comprises a cache memory.

3. The electronic device of claim 1, further comprising a power manager to selectively enable the selected wordline driver in response to determining the address associated with the memory access request.

4. The electronic device of claim 1, wherein each of the plurality of wordline drivers includes a high voltage threshold (VT) transistor.

5. An electronic device comprising:
   a memory including a plurality of wordlines;
   a plurality of wordline drivers coupled to the memory, each wordline driver associated with a wordline of the plurality of wordlines, wherein power to each of the plurality of wordline drivers is off during a default state, except during a wordline access period;
   wherein each of the plurality of wordline drivers comprises:
      a first AND-gate including a first input to receive an enable signal, a second input to receive a clock signal, and an output;
      a second AND-gate including a first input and a second input to receive precode data, and an output;
      a NAND-gate including a power terminal, a first input coupled to the output of the first AND-gate, a second input coupled to the output of the second AND-gate, and an output;
      an inverter including a power terminal, an input coupled to the output of the NAND-gate, and an output coupled to a selected wordline;
      a head switch including a first terminal coupled to a supply voltage terminal, a control terminal, and a second terminal coupled to the power terminal of the inverter;
      a foot switch including a first terminal coupled to the supply voltage terminal; a control terminal, and a second terminal coupled to the power terminal of the NAND gate;
   a decoder coupled to the plurality of wordline drivers to receive a memory access request and to decode the memory access request to determine an address associated with the memory access request, the decoder to power a selected wordline driver, but not other wordline drivers of the plurality of wordline drivers; and
   wherein the decoder produces a wordline enable signal coupled to the control terminals of the head switch and the foot switch to selectively power the wordline driver.

6. A processor readable medium embodying processor readable instructions, the processor readable instructions comprising:
   instructions to decode a memory access request to determine a memory address corresponding to a selected wordline of a memory including a plurality of wordlines, wherein the memory includes a plurality of memory banks, each of the plurality of memory banks including a pair of sub-banks, the pair of sub-banks to share pre-decode data; and
   instructions to selectively power a wordline driver associated with the selected wordline without applying power to other wordlines of the plurality of wordlines, in response to determining the memory address.

7. The processor readable medium of claim 6, wherein the memory comprises a level two cache memory.

8. The processor readable medium of claim 6, wherein the processor readable instructions include instructions to perform a read operation on the selected wordline.

9. The processor readable medium of claim 6, wherein the processor readable instructions include instructions to perform a write operation on the selected wordline.

10. A memory device comprising:
    storage means including a plurality of wordlines, wherein the storage means includes a plurality of memory banks, each of the plurality of memory banks including a pair of sub-banks, the pair of sub-banks to share pre-decode data;
    means for decoding an address input to determine a memory address corresponding to a selected one of the plurality of wordlines; and
    means for powering the selected one of the plurality of wordlines but not other wordlines of the plurality of wordlines in response to determining the memory address.

11. The memory device of claim 10, further comprising:
    switching means to selectively couple the means for decoding to a power supply terminal.

* * * * *